United States Patent
Hung et al.

(10) Patent No.: US 11,903,203 B2
(45) Date of Patent: Feb. 13, 2024

(54) 3D AND FLASH MEMORY DEVICE AND METHOD OF FABRICATING THE SAME

(71) Applicant: MACRONIX International Co., Ltd., Hsinchu (TW)

(72) Inventors: Min-Feng Hung, Hsing-Chu (TW); Li-Yen Liang, Hsing-Chu (TW); Chia-Tze Huang, Hsing-Chu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 374 days.

(21) Appl. No.: 17/461,518

(22) Filed: Aug. 30, 2021

(65) Prior Publication Data

US 2023/0066310 A1 Mar. 2, 2023

(51) Int. Cl.
*H01L 27/11582* (2017.01)
*H10B 43/27* (2023.01)
*H10B 43/10* (2023.01)
*G11C 16/04* (2006.01)

(52) U.S. Cl.
CPC .............. *H10B 43/27* (2023.02); *H10B 43/10* (2023.02); *G11C 16/0466* (2013.01)

(58) Field of Classification Search
CPC ........ H10B 43/20; H10B 43/27; H10B 43/10; G11C 16/0466; G11C 16/10; G11C 16/0408; G11C 16/0416; H01L 21/28; H01L 21/028; H01L 21/02211; H01L 27/14647; H01L 27/11582; H01L 27/11565; H01L 29/40117; H01L 29/7827; H01L 29/105; H01L 29/167
See application file for complete search history.

(56) References Cited

U.S. PATENT DOCUMENTS

| | | | | |
|---|---|---|---|---|
| 2020/0266204 A1* | 8/2020 | Howder | ................. | H10B 41/35 |
| 2021/0066460 A1* | 3/2021 | Haller | ............... | H01L 21/02636 |
| 2021/0082933 A1* | 3/2021 | Ito | ............... | G11C 5/06 |
| 2022/0336485 A1* | 10/2022 | Howder | ................. | H10B 43/27 |
| 2022/0406805 A1* | 12/2022 | Yang | .................... | H10B 43/35 |

FOREIGN PATENT DOCUMENTS

| | | |
|---|---|---|
| TW | 201212160 | 3/2012 |
| TW | 201236112 | 9/2012 |

OTHER PUBLICATIONS

"Office Action of Taiwan Counterpart Application", dated Apr. 11, 2022, p. 1-p. 4.

* cited by examiner

*Primary Examiner* — Nikolay K Yushin
(74) *Attorney, Agent, or Firm* — J.C. PATENTS

(57) ABSTRACT

A 3D AND flash memory device includes a gate stack structure, a channel pillar, a first and a second conductive pillars, a charge storage structure, and a protective cap. The gate stack structure is disposed on a dielectric substrate and includes gate layers and insulating layers alternately stacked with each other. The channel pillar penetrates through the gate stack structure. The first and the second conductive pillars are disposed in the channel pillar and penetrate through the gate stack structure, and the first and the second conductive pillars are separated from each other and each connected to the channel pillar. The charge storage structure is disposed between the gate layers and a sidewall of the channel pillar. The protective cap covers at least a top surface of the channel pillar and isolates the first conductive pillar and the second conductive pillar from a top gate layer of the gate layers.

19 Claims, 15 Drawing Sheets

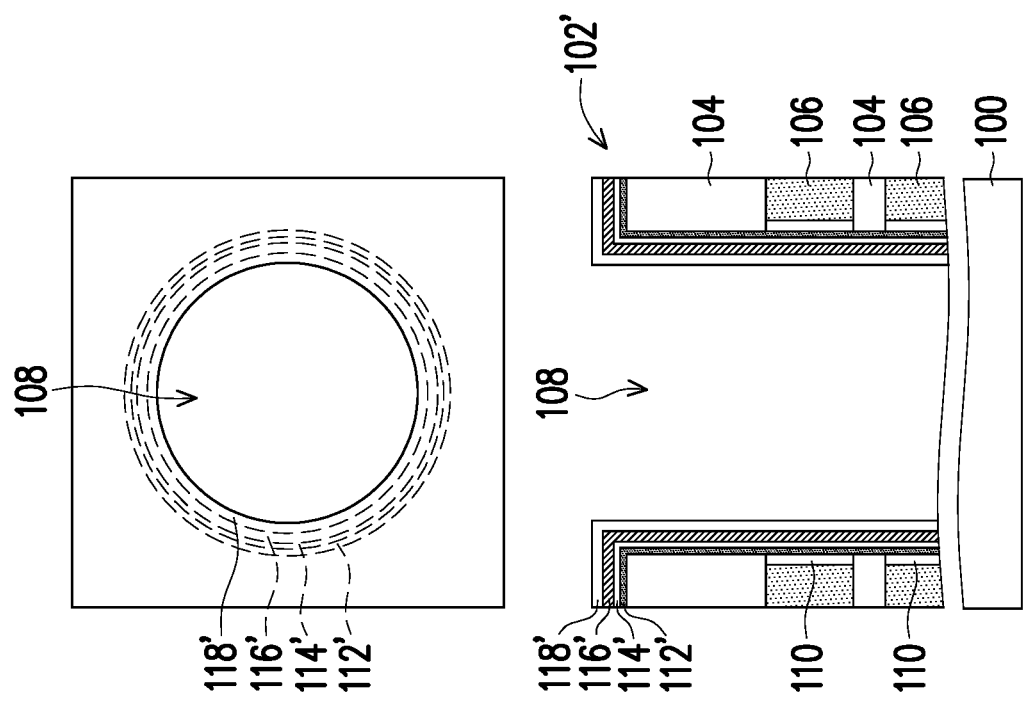
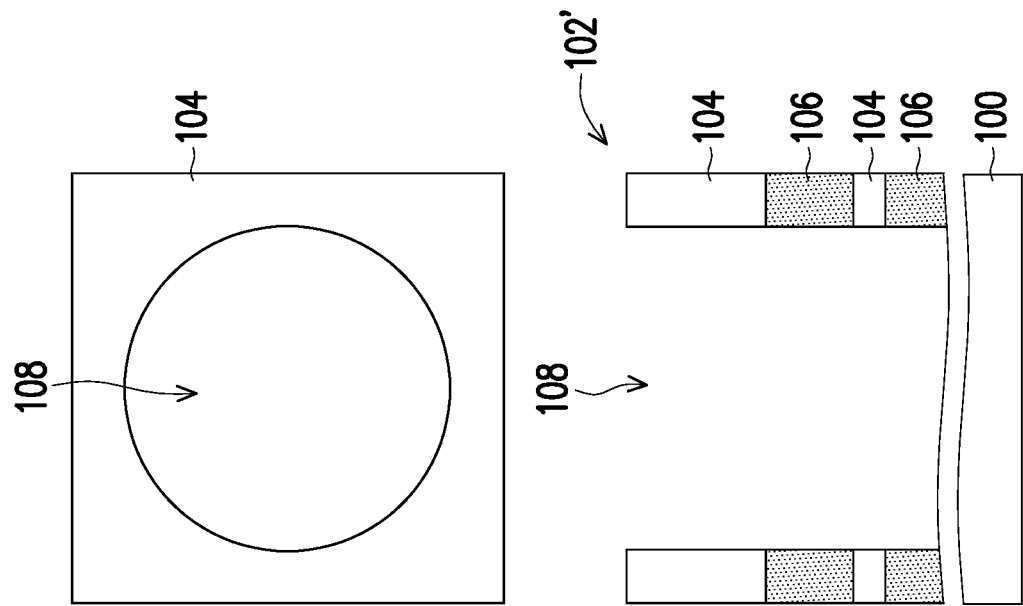
FIG. 2B
FIG. 2A

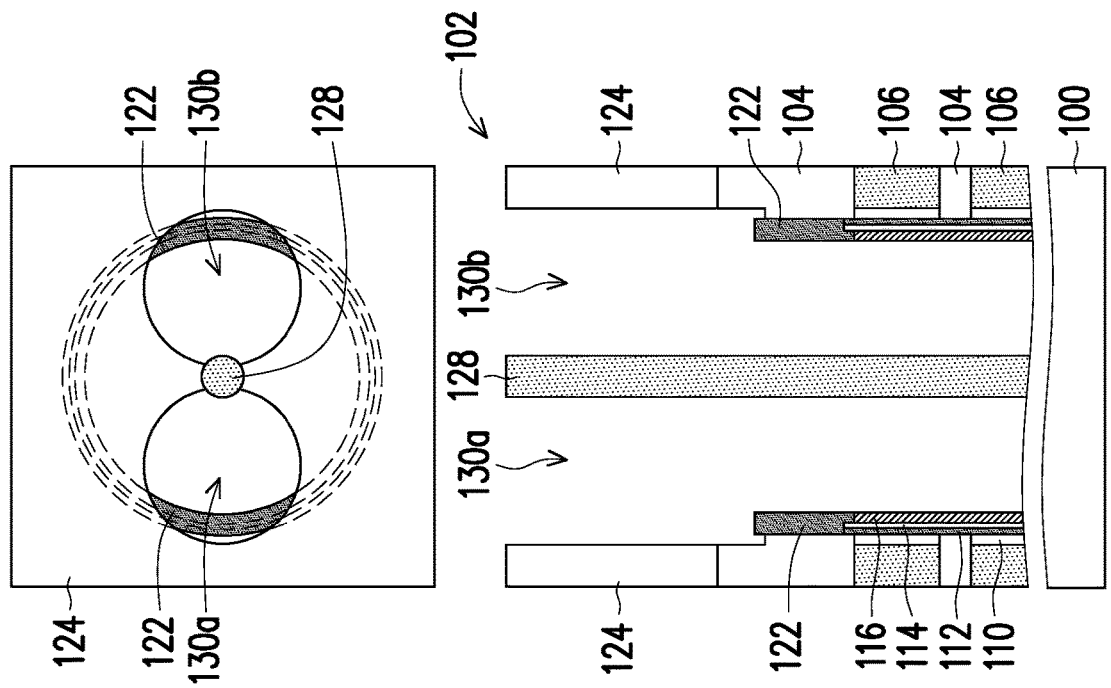
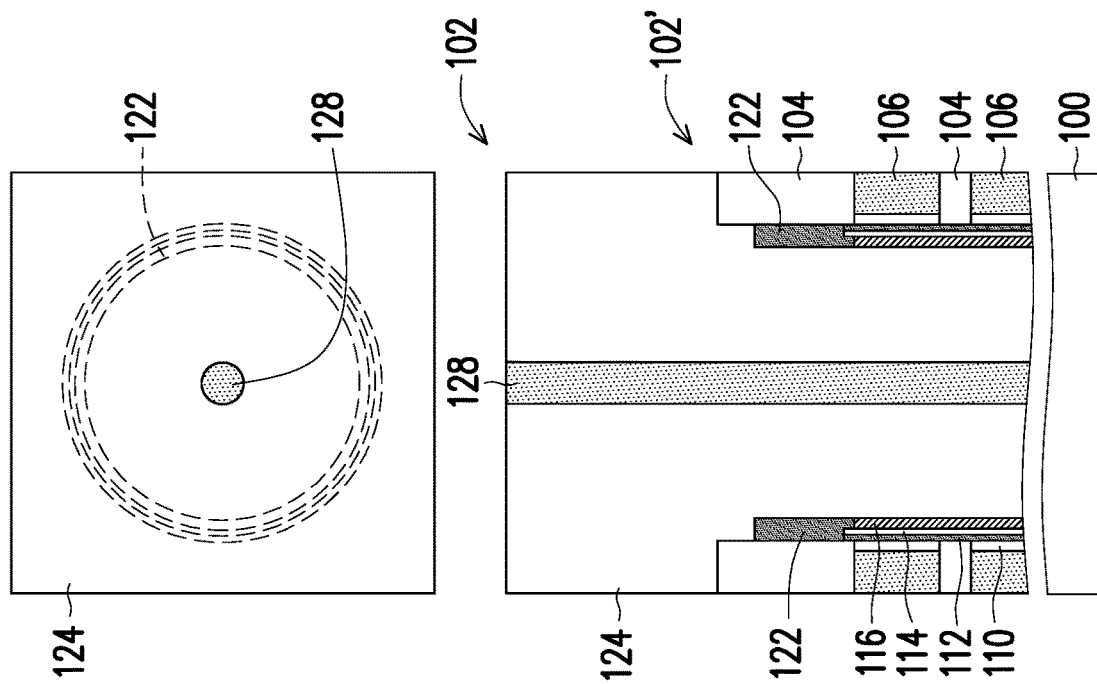
FIG. 2H
FIG. 2G

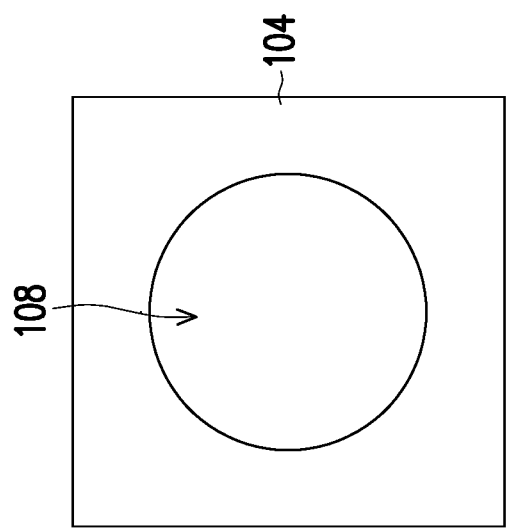
FIG. 3A
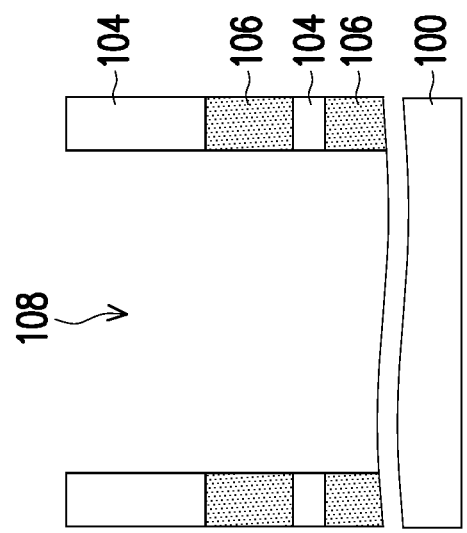
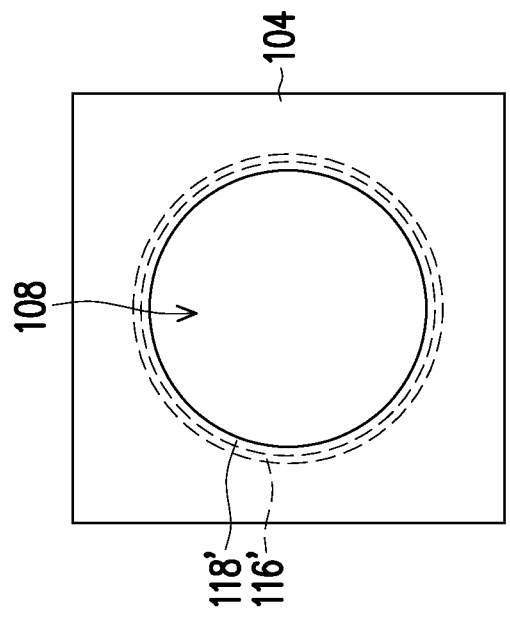
FIG. 3B
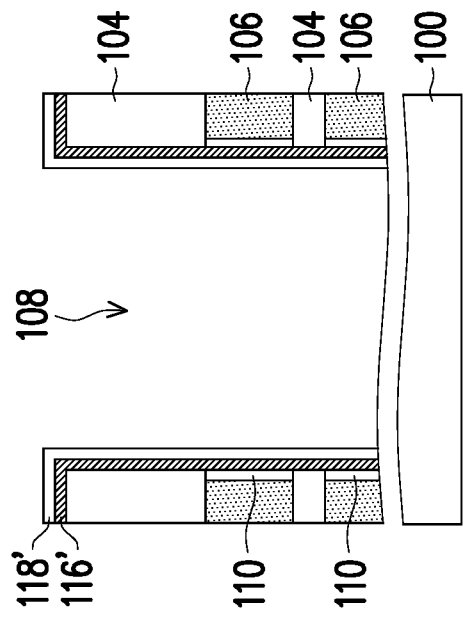

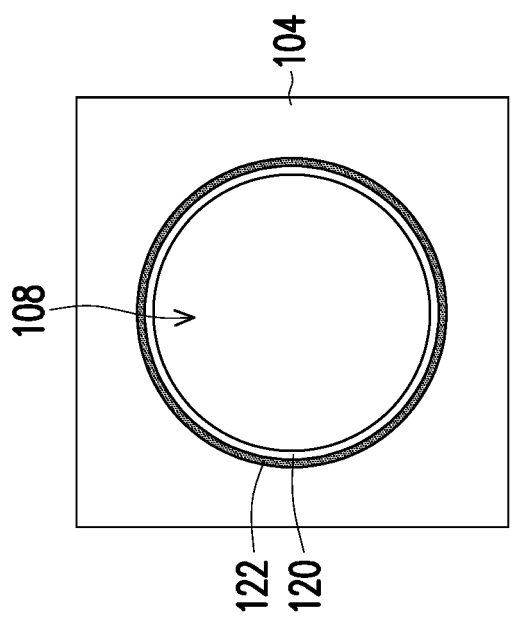
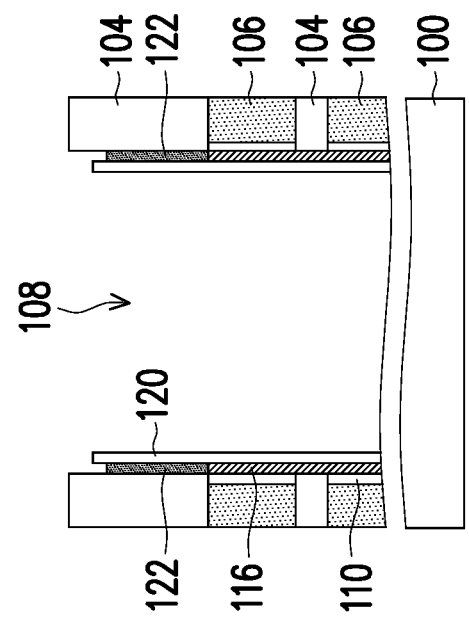
FIG. 3E
FIG. 3F

3D AND FLASH MEMORY DEVICE AND METHOD OF FABRICATING THE SAME

BACKGROUND

Technical Field

The embodiment of the disclosure relates to a memory device and a method of fabricating the same, and particularly, to a 3D AND flash memory device and a method of fabricating the same.

Description of Related Art

Since a non-volatile memory (e.g., a flash memory) has the advantage that stored data does not disappear at power-off, it becomes a widely used memory for a personal computer or other electronics equipment.

Currently, the three-dimensional (3D) flash memory commonly used in the industry includes a NOR flash memory and a NAND flash memory. In addition, another type of 3D flash memory is a 3D AND flash memory, which can be applied to a multi-dimensional flash memory array with high integration and high area utilization, and has an advantage of a fast operation speed. Therefore, the development of a 3D flash memory has gradually become the current trend.

SUMMARY

The embodiment of the disclosure provides a 3D AND flash memory device and a method of fabricating the same, which can prevent form shorting or having leakage path between conductive pillar to the top-most world line layer.

According to an embodiment of the disclosure, a 3D AND flash memory device include a gate stack structure, a channel pillar, a first conductive pillar and a second conductive pillar, a charge storage structure, and a protective cap. The gate stack structure is disposed on a dielectric substrate and includes a plurality of gate layers and a plurality of insulating layers alternately stacked with each other. The channel pillar is disposed on the dielectric substrate and penetrates through the gate stack structure. The first conductive pillar and the second conductive pillar are disposed in the channel pillar and penetrate through the gate stack structure. The first conductive pillar and the second conductive pillar are separated from each other and are each connected to the channel pillar. The charge storage structure is disposed between the gate layers and a sidewall of the channel pillar. The protective cap covers at least a top surface of the channel pillar, isolates the first conductive pillar from a top gate layer of the plurality of gate layers, and isolates the second conductive pillar from the top gate layer of the plurality of gate layers.

According to an embodiment of the disclosure, a fabrication method of a 3D AND flash memory device includes the following steps. A stack structure is formed on a dielectric substrate, and the stack structure includes a plurality of sacrificial layers and a plurality of insulating layers alternately stacked with each other. An opening is formed in the stack structure. A channel pillar is formed in the opening. A protective cap is formed on the channel pillar. An insulating filling layer is formed on the stack structure and the protective cap and is filled in the opening. The insulating filling layer is patterned with the protective cap protecting the channel pillar to form a first hole and a second hole in the channel pillar. A first conductive pillar and a second conductive pillar connected to the channel pillar are formed in the first hole and the second hole, respectively. A replacement process is performed to replace the sacrificial layers with a plurality of gate layers. A charge storage structure is formed between the gate layers and a sidewall of the channel pillar.

In the embodiment of the disclosure, the protective cap is covered on the channel pillar so that the channel pillar may be prevented from being damaged in a subsequent etching process

BRIEF DESCRIPTION OF THE DRAWINGS

FIG. 2A to FIG. 2I are schematic cross-sectional views and top views showing a fabrication process of a 3D AND flash memory device according to an embodiment of the disclosure.

FIG. 3A to FIG. 3I are schematic cross-sectional views and top views showing a fabrication process of a 3D AND flash memory device according to another embodiment of the disclosure.

DESCRIPTION OF THE EMBODIMENTS

Figure 1A:
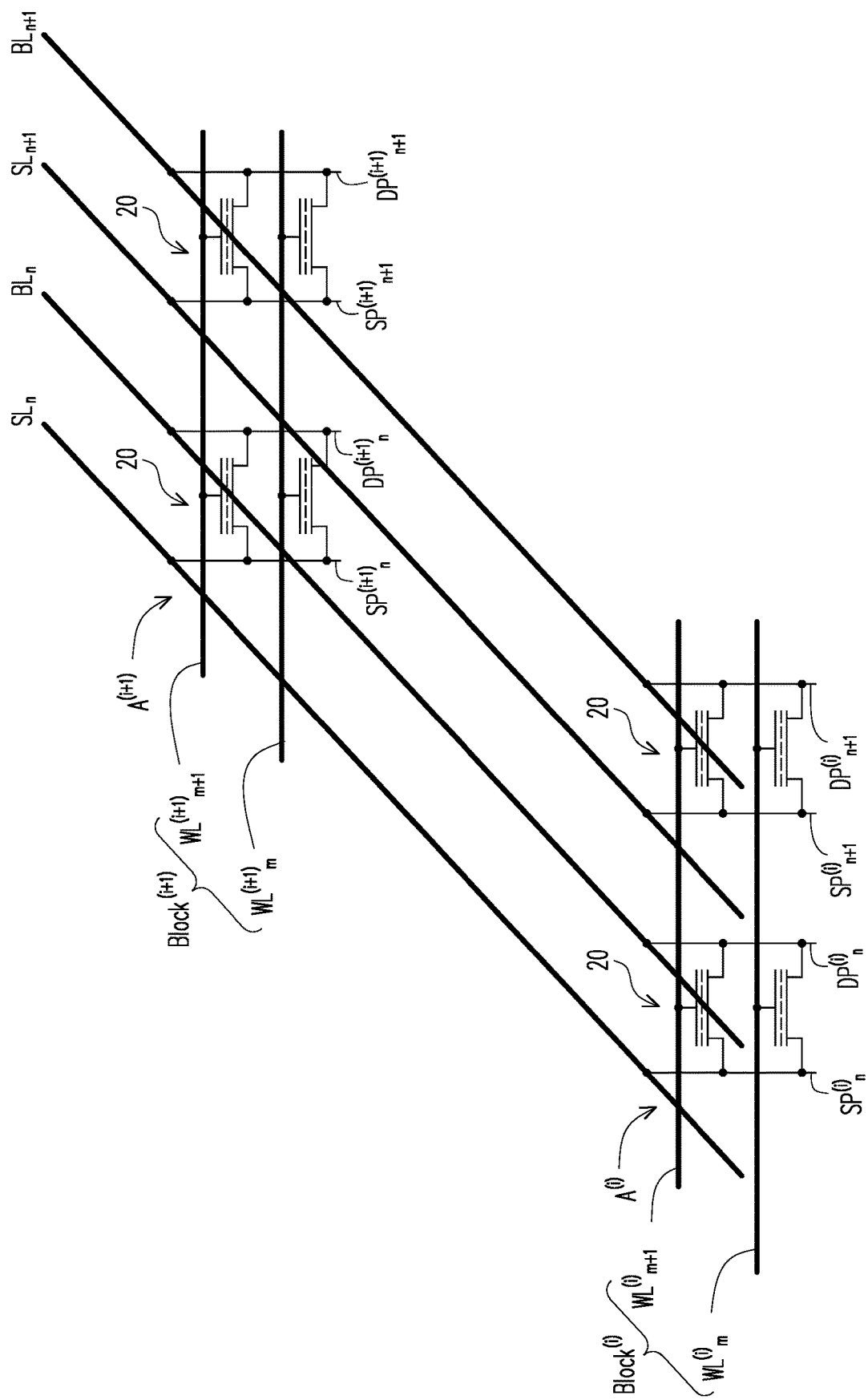
FIG. 1A is a circuit diagram showing a 3D AND flash memory array according to an embodiment.
Figure 1B:
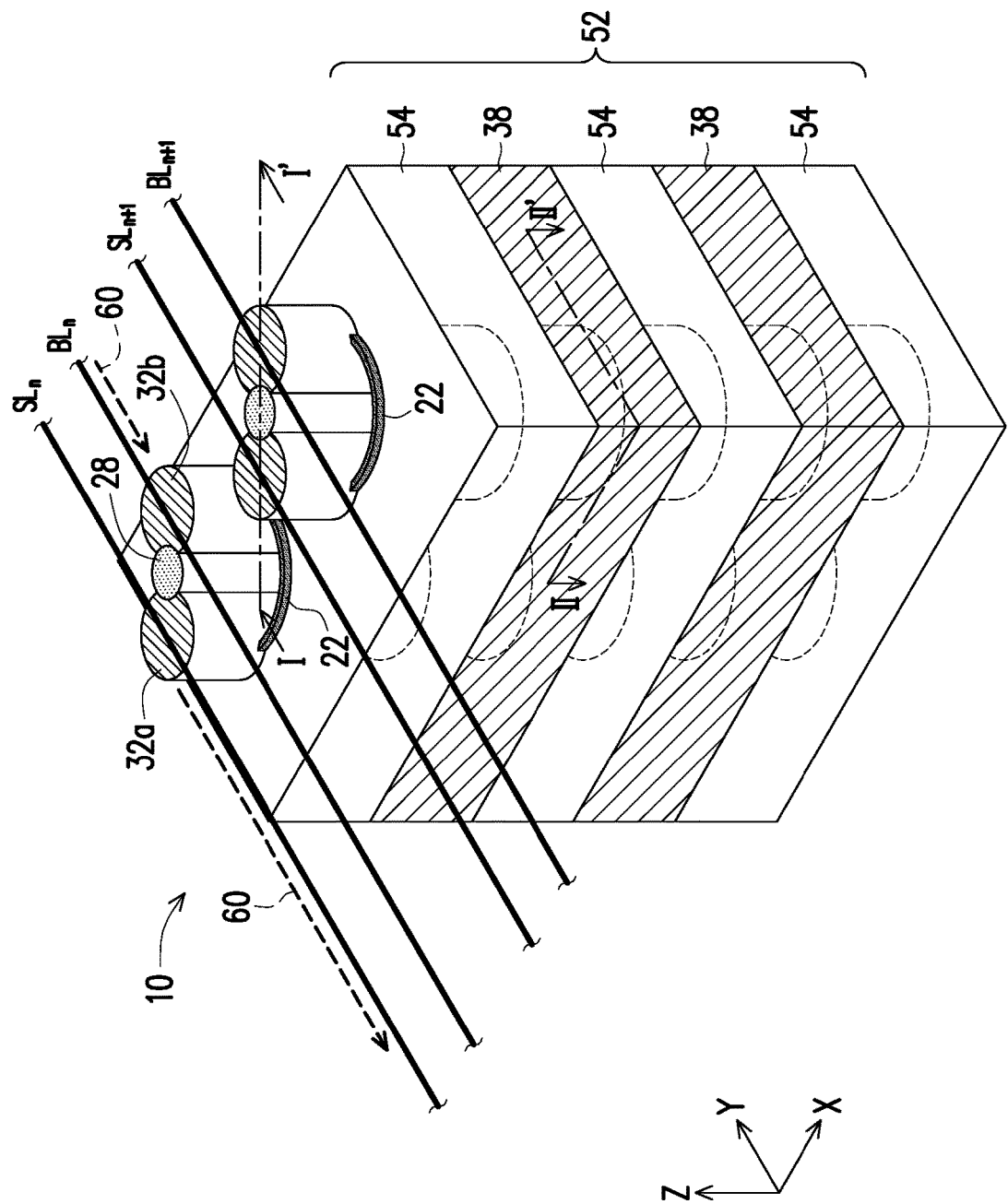
FIG. 1B is a simplified perspective view showing a 3D AND flash memory array according to some embodiments.
Figure 1C:
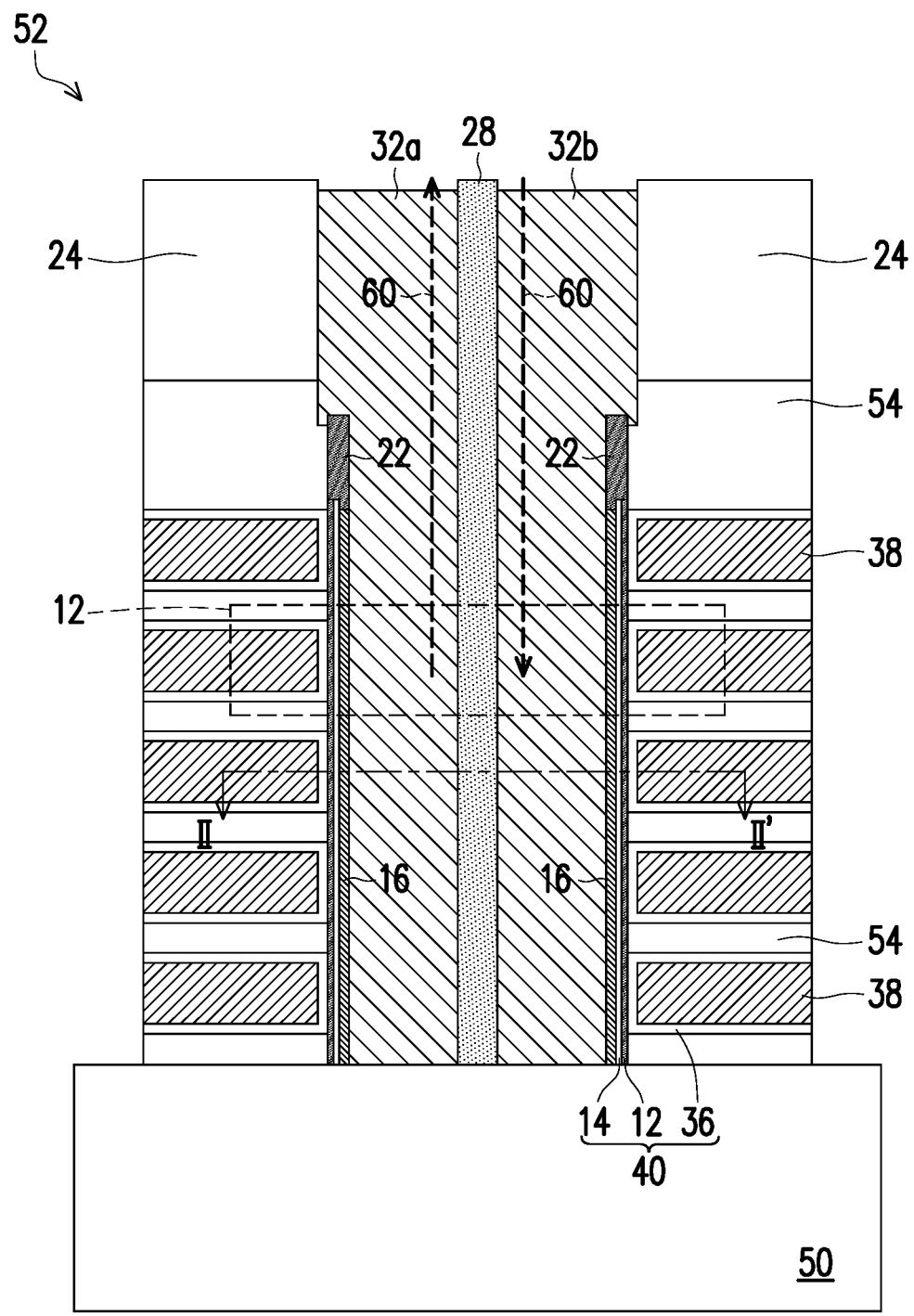
FIG. 1C and FIG. 1D are cross-sectional views of a 3D AND flash memory array according to some embodiments.
Figure 1D:
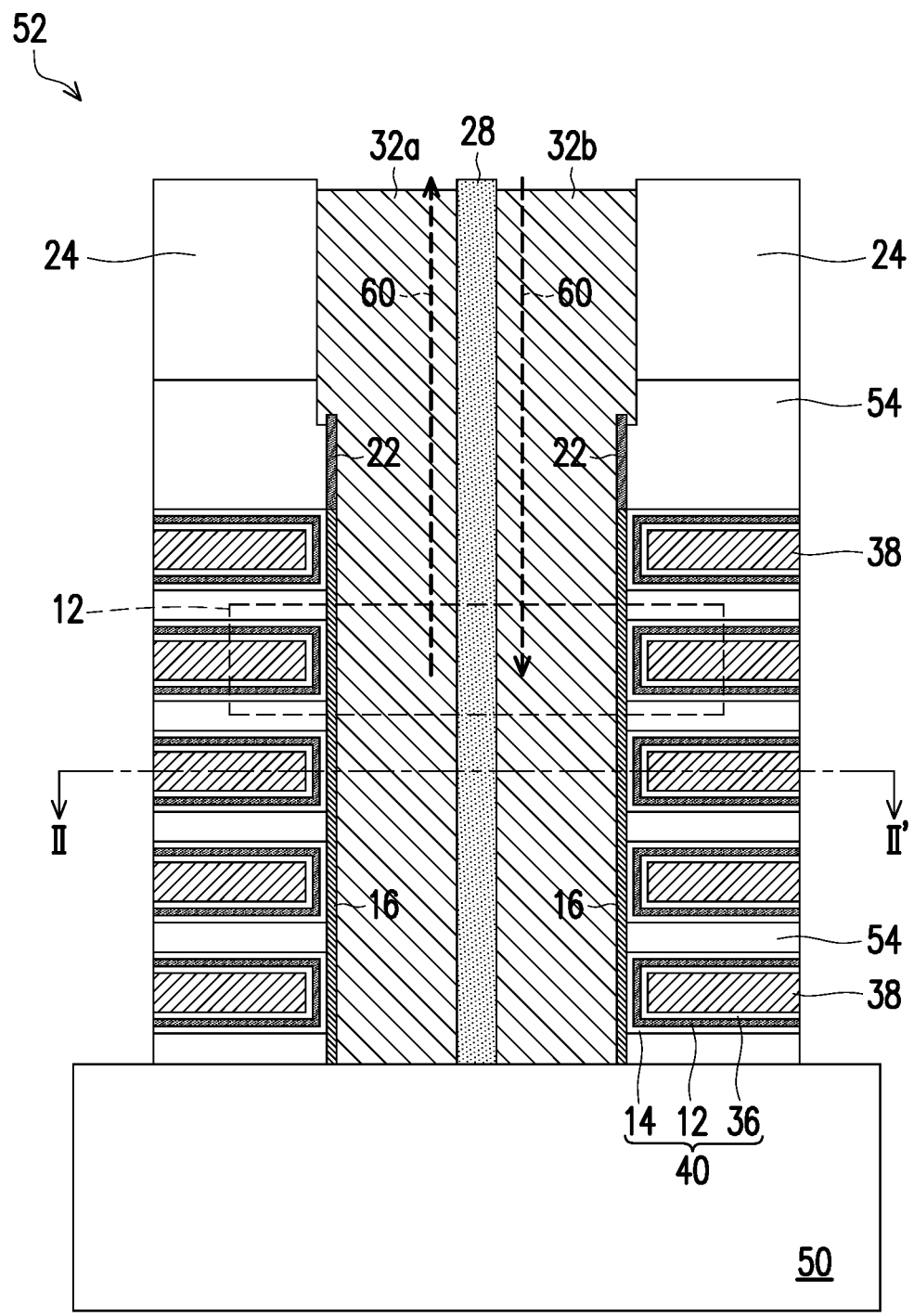
Figure 1E:
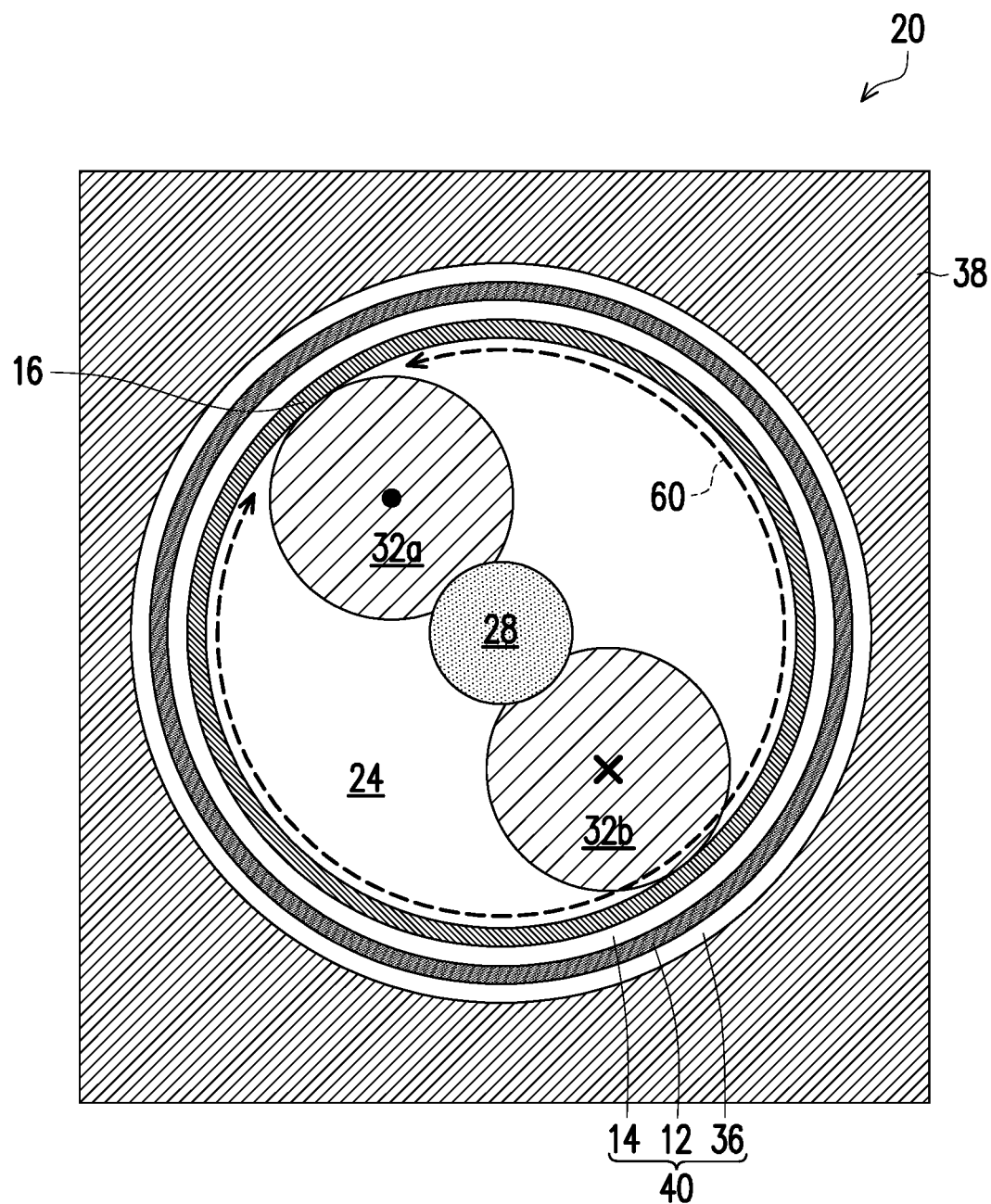
FIG. 1E is a top view of a 3D AND flash memory cell.

FIG. 1A is circuit diagrams showing a 3D AND flash memory array according to some embodiments. FIG. 1B is a partial three-dimensional simplified view showing a part of a memory array 10 in FIG. 1A. FIG. 1C and FIG. 1D are cross-sectional views taken along line I-I' in FIG. 1B. FIG. 1E is a top view taken along line II-II' in FIG. 1B, FIG. 1C and FIG. 1D.

FIG. 1A shows a schematic view of two blocks BLOCK$^{(i)}$ and BLOCK$^{(i+1)}$ of a vertical AND memory array 10 arranged in rows and columns. The block BLOCK$^{(i)}$ includes a memory array A$^{(i)}$. A row (e.g., an (m+1)$^{th}$ row) of the memory array A$^{(i)}$ is a set of AND memory cells 20 having a common word line (e.g., WL$^{(i)}_{m+1}$). The AND memory cells 20 of the memory array A$^{(i)}$ in each row (e.g., the (m+1)$^{th}$ row) correspond to a common word line (e.g., WL$^{(i)}_{m+1}$) and are coupled to different source pillars (e.g., SP$^{(i)}_n$ and SP$^{(i)}_{n+1}$) and drain pillars (e.g., DP$^{(i)}_n$ and DP$^{(i)}_{n+1}$), so that the AND memory cells 20 are logically arranged in a row along the common word line (e.g., WL$^{(i)}_{m+1}$).

A column (e.g., an n$^{th}$ column) of the memory array A$^{(i)}$ is a set of AND memory cells 20 having a common source pillar (e.g., SP$^{(i)}_n$) and a common drain pillar (e.g., DP$^{(i)}_n$). The AND memory cells 20 of the memory array A$^{(i)}$ in each column (e.g., the n$^{th}$ column) correspond to different word lines (e.g., WL$^{(i)}_{m+1}$ and WL$^{(i)}_m$) and are coupled to a common source pillar (e.g., SP$^{(i)}_n$) and a common drain pillar (e.g., DP$^{(i)}_n$). Hence, the AND memory cells 20 of the memory array A$^{(i)}$ are logically arranged in a column along the common source pillar (e.g., SP$^{(i)}_n$) and the common drain pillar (e.g., DP$^{(i)}_n$. In the physical layout, according to the fabrication method as applied, the columns or rows may be twisted and arranged in a honeycomb pattern or other patterns for high density or other reasons.

In FIG. 1A, in the block BLOCK$^{(i)}$, the AND memory cells 20 in the n$^{th}$ column of the memory array A$^{(i)}$ share a common source pillar (e.g., SP$^{(i)}_n$) and a common drain pillar (e.g., DP$^{(i)}_n$). The AND memory cells 20 in an (n+1)$^{th}$ column share a common source pillar (e.g., $SP^{(i)}_{n+1}$) and a common drain pillar (e.g., $DP^{(i)}_{n+1}$). The common source pillar (e.g., $SP^{(i)}_{n}$) is coupled to a common source line (e.g., $SL_n$), and the common drain pillar (e.g., $DP^{(i)}_n$) is coupled to a common bit line (e.g., $BL_n$). The common source pillar (e.g., $SP^{(i)}_{n+1}$) is coupled to a common source line (e.g., $SL_{n+1}$), and the common drain pillar (e.g., $DP^{(i)}_{n+1}$) is coupled to a common bit line (e.g., $BL_{n+1}$).

Likewise, the block $BLOCK^{(i+1)}$ includes a memory array $A^{(i+1)}$, which is similar to the memory array $A^{(i)}$ in the block $BLOCK^{(i)}$. A row (e.g., an $(m+1)^{th}$ row) of the memory array $A^{(i+1)}$ is a set of AND memory cells 20 having a common word line (e.g., $WL^{(i+1)}_{m+1}$). The AND memory cells 20 the memory array $A^{(i+1)}$ in each row (e.g., the $(m+1)^{th}$ row) correspond to a common word line (e.g., $WL^{(i+1)}_{m+1}$) and are coupled to different source pillars (e.g., $SP^{(i+1)}_n$ and $SP^{(i+1)}_{n+1}$) and drain pillars (e.g., $DP^{(i+1)}_n$ and $DP^{(i+1)}_{n+1}$). A column (e.g., an $n^{th}$ column) of the memory array $A^{(i+1)}$ is a set of AND memory cells 20 having a common source pillar (e.g., $SP^{(i+1)}_n$) and a common drain pillar (e.g., $DP^{(i+1)}_n$). The AND memory cells 20 of the memory array $A^{(i+1)}$ in each column (e.g., the $n^{th}$ column) correspond to different word lines (e.g., $WL^{(i+1)}_{m+1}$ and $WL^{(i+1)}_n$) and are coupled to a common source pillar (e.g., $SP^{(i+1)}_n$) and a common drain pillar (e.g., $DP^{(i+1)}_n$). Hence, the AND memory cells 20 of the memory array $A^{(i+1)}$ are logically arranged in a column along the common source pillar (e.g., $SP^{(i+1)}_n$) and the common drain pillar (e.g., $DP^{(i+1)}_n$).

The block $BLOCK^{(i+1)}$ and the block $BLOCK^{(i)}$ share source lines (e.g., $SL_n$ and $SL_{n+1}$) and bit lines (e.g., $BL_n$ and $BL_{n+1}$). Therefore, the source line $SL_n$ and the bit line $BL_n$ are coupled to the $n^{th}$ column of AND memory cells 20 in the AND memory array $A^{(i)}$ of the block $BLOCK^{(i)}$, and are coupled to the $n^{th}$ column of AND memory cells 20 in the AND memory array $A^{(i+1)}$ of the block $BLOCK^{(i+1)}$. Similarly, the source line $SL_{n+1}$ and the bit line $BL_{n+1}$ are coupled to the $(n+1)^{th}$ column of AND memory cells 20 in the AND memory array $A^{(i)}$ of the block $BLOCK^{(i)}$, and are coupled to the $(n+1)^{th}$ column of AND memory cells 20 in the AND memory array $A^{(i+1)}$ of the block $BLOCK^{(i+1)}$.

Referring to FIG. 1B, the memory array 10 may be disposed in a back end of line (BEOL) of a semiconductor die. For example, the memory array 10 may be disposed in an interconnect structure of a semiconductor die, for example, being disposed on one or more active devices (e.g., transistors) formed on a semiconductor substrate.

Referring to FIG. 1B, the memory array 10 includes a gate stack structure 52. The gate stack structure 52 includes a plurality of gate layers (also referred to as word lines) 38 and a plurality of insulating layers 54 vertically stacked on the surface of a dielectric substrate 50. The gate layers 38 are electrically isolated from each other by the insulating layers 54 disposed therebetween. The gate layers 38 extend in a direction parallel to the surface of the dielectric substrate 50 (shown in FIG. 1C). The gate layers 38 may have a staircase structure (not shown), so that a lower gate layer 38 is longer than an upper gate layer 38, and the end of a lower gate layer 38 extends laterally beyond the end of an upper gate layer 38. A contact used to connect the gate layer 38 may land on the end of the gate layer 38 to thereby connect the gate layers 38 to conductive lines.

Referring to FIG. 1B to FIG. 1D, the memory array 10 further includes a plurality of channel pillars 16. The channel pillar 16 continuously extends through the gate stack structure 52. In some embodiments, the channel pillar 16 may have a ring-shaped profile in a top view.

Referring to FIG. 1B to FIG. 1D, the memory array 10 further includes a plurality of first conductive pillars 32a and a plurality of second conductive pillars 32b. In this example, the first conductive pillars 32a act as source pillars. The second conductive pillars 32b act as drain pillars. The first and second conductive pillars 32a and 32b and an insulating pillar 28 are disposed in the channel pillar 16 and each extend in a direction perpendicular to the gate layer 38. The first and second conductive pillars 32a and 32b are separated from each other by the insulating pillar 28 and are electrically coupled to the channel pillar 16.

Referring to FIGS. 1C and 1D, at least a portion of a charge storage structure 40 is disposed between the channel pillar 16 and the gate layers 38. The charge storage structure 40 may include a tunneling layer (or referred to as a bandgap engineered tunneling oxide layer) 14, a storage layer 12, and a blocking layer 36. The storage layer 12 is located between the tunneling layer 14 and the blocking layer 36. In some embodiments, the tunneling layer 14, the storage layer 12, and the blocking layer 36 are, for example, silicon oxide, silicon nitride, and silicon oxide. In some embodiments as shown in FIG. 1C, a part (the tunneling layer 14 and the storage layer 12) of the charge storage structure 40 continuously extends in a direction perpendicular to the gate layer 38, and the other part (the blocking layer 36) of the charge storage structure 40 surrounds the gate layer 38. In other embodiments as shown in FIG. 1D, the charge storage structure 40 (the tunneling layer 14, the storage layer 12, and the blocking layer 36) surrounds the gate layer 38.

Referring to FIG. 1E, a memory cell 20 includes the gate layer 38 surrounding the charge storage structure 40, the channel pillar 16, the first conductive pillar 32a, and the second conductive pillar 32b An insulating filling layer 24 is filled in a gap surrounded by the channel pillar 16 and not occupied by the first conductive pillar 32a, the second conductive pillar 32b and insulating pillar 28. During operation, a voltage is applied to a selected word line (gate layer) 38; for example, when a voltage higher than a corresponding threshold voltage ($V_{th}$) of the corresponding memory cell 20 is applied, a channel region of the channel pillar 16 intersecting the selected word line 38 is turned on to allow a current to enter the second conductive 32b from the bit line $BL_n$ or $BL_{n+1}$ (shown in FIG. 1B), flow to the first conductive pillar 32a via the turned-on channel region (e.g., in a direction indicated by arrow 60), and finally flow to the source line $SL_n$ or $SL_{n+1}$ (shown in FIG. 1B).

Referring to FIG. 1C to FIG. 1E, the first conductive pillar 32a and the second conductive pillar 32b are formed by forming a hole respectively in the insulating filling layer 24 by an etching process and then backfilling a conductive layer in the hole. However, in the etching process for forming the hole, the top surface of the channel pillar 16 may be damaged by the etching. If the height of the channel pillar 16 is not improperly control, short circuit or leakage path between the conductive pillar 32a or 32b to the top-most gate layer 38 may occur.

Referring to FIG. 1C and FIG. 1D, in the disclosure, a protective cap 22 is formed on the channel pillar 16 and may prevent the channel pillar 16 from being damaged by etching. Therefore, the top surface of the channel pillar 16 can be controlled to be flush or substantially flush with the top surface of the charge storage structure 40 at the top surface of the uppermost gate layer 38, so that the device can exhibit good reliability. The protective cap 22 on the channel pillar 16 prevent form shorting or having leakage path between the conductive pillar 32a or 32b to a top corner of the top-most gate layer 38. This will be described in detail below with reference to FIG. 2A to FIG. 2I.

FIG. 2A to FIG. 2I are schematic cross-sectional views and top views showing a process of fabricating a 3D AND flash memory device according to an embodiment of the disclosure.

Referring to FIG. 2A, a stack structure 102' is formed on a dielectric substrate 100. The dielectric substrate 100 is, for example, a dielectric layer (e.g., a silicon oxide layer) over an interconnect structure formed on a silicon substrate. The stack structure 102' may also be referred to as an insulating stack structure 102'. In the embodiments the stack structure 102' may be composed of sacrificial layers 106 and insulating layers 104 which are sequentially alternately stacked on the dielectric substrate 100. In addition, in this embodiment, the uppermost layer of the stack structure 102' is the insulating layer 104. In other embodiments, either the insulating layers 104 or the sacrificial layers 106 can be the lowermost layer. The insulating layer 104 is, for example, a silicon oxide layer. The sacrificial layer 106 is, for example, a silicon nitride layer. In this embodiment, the stack structure 102' has two insulating layers 104 and two sacrificial layers 106, but the disclosure is not limited thereto. In other embodiments, more insulating layers 104 and more sacrificial layers 106 may be formed according to the actual requirements.

A plurality of openings 108 are formed in the stack structure 102'. However, for clarity, only one opening 108 is shown in the figures. In this embodiment, the bottom surface of the opening 108 exposes the dielectric substrate 100, but the disclosure is not limited thereto. In other embodiments, when the lowermost layer of the stack structure 102' is the insulating layer 104, the bottom of the opening 108 may be located in the lowermost insulating layer 104; namely, the bottom surface of the opening 108 exposes the lowermost insulating layer 104 without exposing the dielectric substrate 100. Alternatively, in other embodiments, the bottom of the opening 108 further extends into the dielectric substrate 100. In this embodiment, in a top view, the opening 108 has a circular profile, but the disclosure is not limited thereto. In other embodiments, the opening 108 may have a profile in other shapes such as a polygon (not shown).

Referring to FIG. 2B, a thermal oxidation process is performed to oxidize the surfaces of the sidewalls of the sacrificial layers 106 exposed by the opening 108 to form oxide layers 110. Next, a storage material layer 112', a tunneling material layer 114', and a channel material layer 116' are formed on the stack structure 102' and in the opening 108. The storage material layer 112' is, for example, a silicon oxide layer. The tunneling material layer 114' is, for example, a silicon nitride layer. The material of the channel material layer 116' may be a semiconductor material such as undoped polysilicon.

In the embodiment of the disclosure, after the channel material layer 116' is formed, a spacer material layer 118' is further formed on the channel material layer 116'. The material of the spacer material layer 118' and the material of the channel material layer 116' are different and have different etching rates. The material of the spacer material layer 118' is, for example, silicon oxide.

Figure 2D:
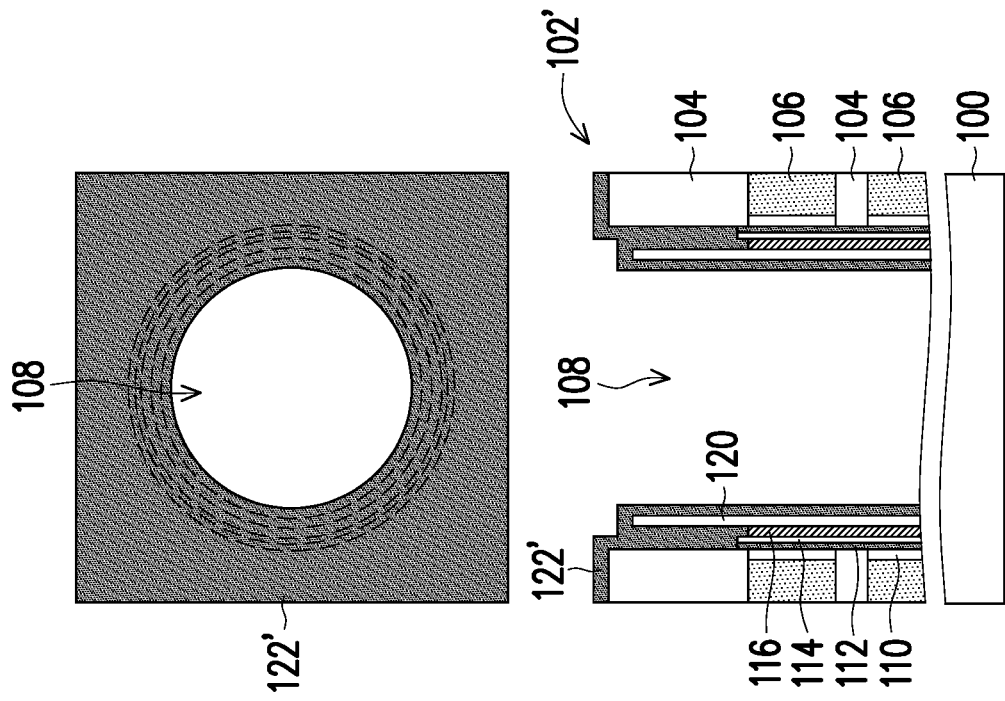
Figure 2C:
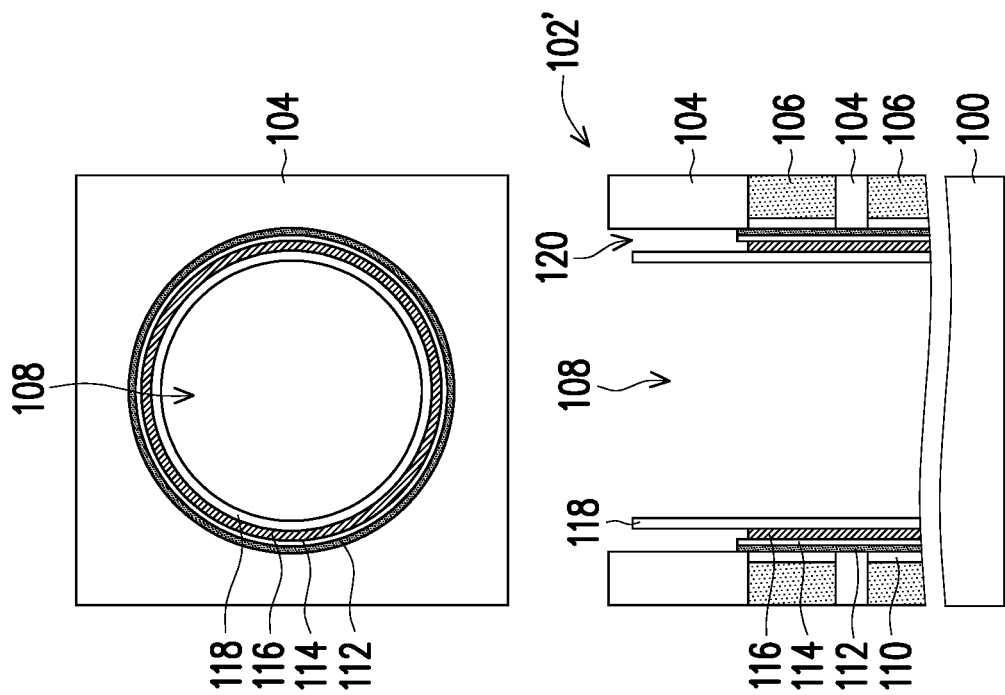

Referring to FIG. 2C, an etch-back process is performed to partially remove the storage material layer 112', the tunneling material layer 114', the channel material layer 116', and the spacer material layer 118' to form a storage layer 112, a tunneling layer 114, a channel pillar 116, and a spacer 118. The storage layer 112, the tunneling layer 114, and the channel pillar 116 cover the sidewall of the opening 108 and expose the bottom of the opening 108. The storage layer 112, the tunneling layer 114, and the channel pillar 116 may penetrate through the stack structure 102' and extend into the dielectric substrate 100. In a top view, the channel pillar 116 has, for example, a ring shape. In a cross-sectional view, the channel pillar 116 may be continuous in its extending direction (e.g., a direction perpendicular to the dielectric substrate 100). In other words, the channel pillar 116 is integral in its extending direction and is not divided into multiple disconnected parts. In some embodiments, the channel pillar 116 may have a circular profile in a top view, but the disclosure is not limited thereto. In other embodiments, the channel pillar 116 may also have a profile in other shapes (e.g., a polygon) in a top view. Furthermore, when performing this etch-back process, the top surface of the channel pillar 116 may be controlled to an appropriate height. For example, the top surface of the channel pillar 116 may be controlled to be coplanar or substantially coplanar with the top surface of a charge storage structure 140 at the top surface of a subsequently formed uppermost gate layer 138. Since the etching rates of the storage material layer 112', the tunneling material layer 114', and the channel material layer 116' are higher than the etching rate of the spacer material layer 118', a groove 120 is formed between the stack structure 102' and the spacer 118. The bottom of the groove 120 exposes the top surface of the channel pillar 116.

Referring to FIG. 2D, a protective material layer 122' is formed on the stack structure 102', in the groove 120, and in the opening 108. The material of the protective material layer 122' is different from the material of the spacer 118 and is different from the material of the channel pillar 116. The material of the protective material layer 122' may be a nitride such as silicon nitride.

Figure 2F:
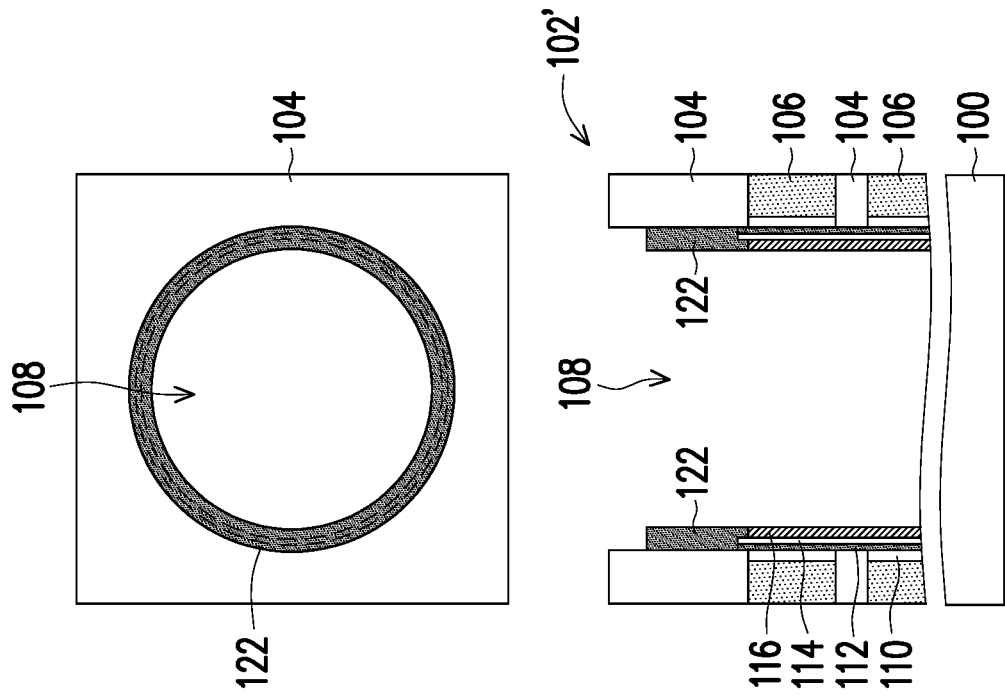
Figure 2E:
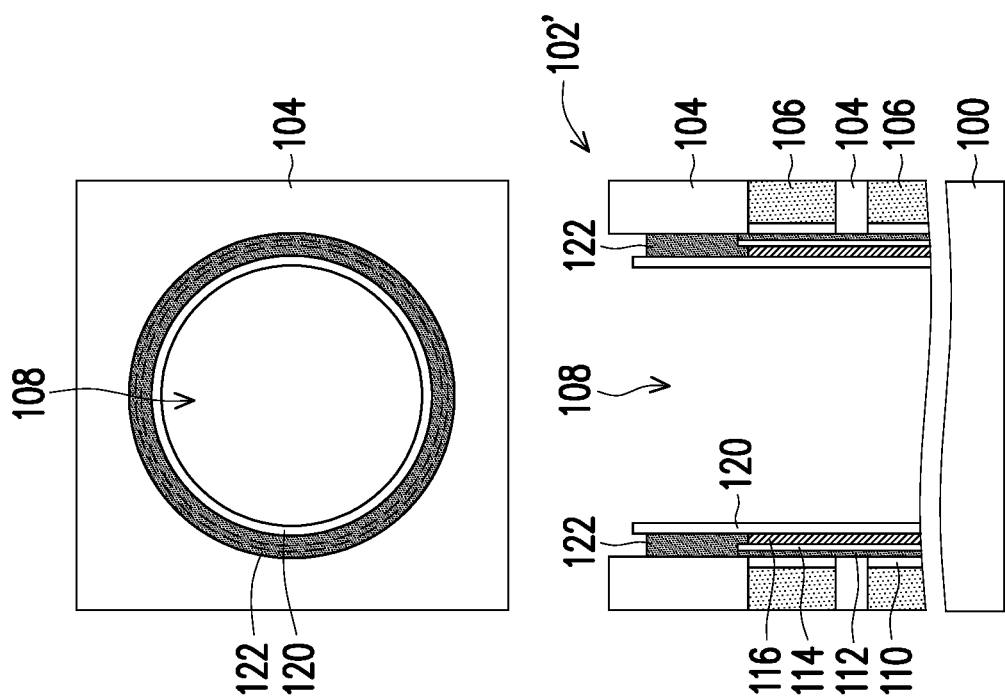

Referring to FIG. 2E, an etch-back process is performed to partially remove the protective material layer 122' to form a protective cap 122 in the groove 120. The protective cap 122 covers at least a top surface of the channel pillar 116. In the present embodiments, the protective cap 122 covers the storage layer 112, the tunneling layer 114, and the channel pillar 116. In some embodiments, the protective cap 122 has a ring shape. The top surface of the protective cap 122 is lower than the top surface of the stack structure 102'.

Referring to FIG. 2F and FIG. 2G, an etching process (e.g., a wet etching process) is performed to remove the spacer 118. Next, an insulating filling layer 124 is formed over the top surface of the stack structure 102' and the dielectric substrate 100. The insulating filling layer 124 covers the stack structure 102' and the protective cap 122 and is filled in the opening 108. The insulating filling layer 124 on the stack structure 102' and the stack structure 102' may be collectively referred to as a stack structure 102. Since the insulating filling layer 124 is located on the stack structure 102', it may also be referred to as an insulating cap layer. The material of the insulating filling layer 124 is different from the material of the protective cap 122. The material of the insulating filling layer 124 is silicon oxide, for example. During filling of the insulating filling layer 124 in the opening 108, the opening 108 is not completely filled and a hole is left at a center region. Then, an insulating material (e.g., silicon nitride) different from the material of the insulating filling layer 124 is filled to completely seal the opening 108. After the insulating material is etched back to the surface of the insulating filling layer 124 through a dry etching or wet etching process, the insulating material remaining at the center region of the opening 108 forms an insulating pillar 128.

Referring to FIG. 2H, a patterning process is performed to form holes 130a and 130b in the insulating filling layer 124. The holes 130a and 130b extend from the top surface of the insulating filling layer 124 to the dielectric substrate 100. The profile of the holes 130a and 130b defined in the patterning process exceeds the profile of the insulating pillar 128. However, since the etching rate of the insulating pillar 128 is lower than the etching rate of the insulating filling layer 124, the insulating pillar 128 is hardly damaged by etching and remains. In addition, the profile of the holes 130a and 130b defined in the patterning process exceeds the profile of the opening 108, so that the holes 130a and 130b expose the protective cap 122 and part of the top insulating layer 104 of the stack structure 102. When performing the patterning process, the protective cap 122 may serve as a hard mask layer to protect the storage layer 112, the tunneling layer 114, and the channel pillar 116 below and prevent the storage layer 112, the tunneling layer 114, and the channel pillar 116 from being damaged by etching. Therefore, the upper portion and the lower portion of the formed holes 130a and 130b have different radial dimensions. The radial dimension of the upper portion of the holes 130a and 130b is larger than the radial dimension of the lower portion of the holes 130a and 130b.

Figure 2I:
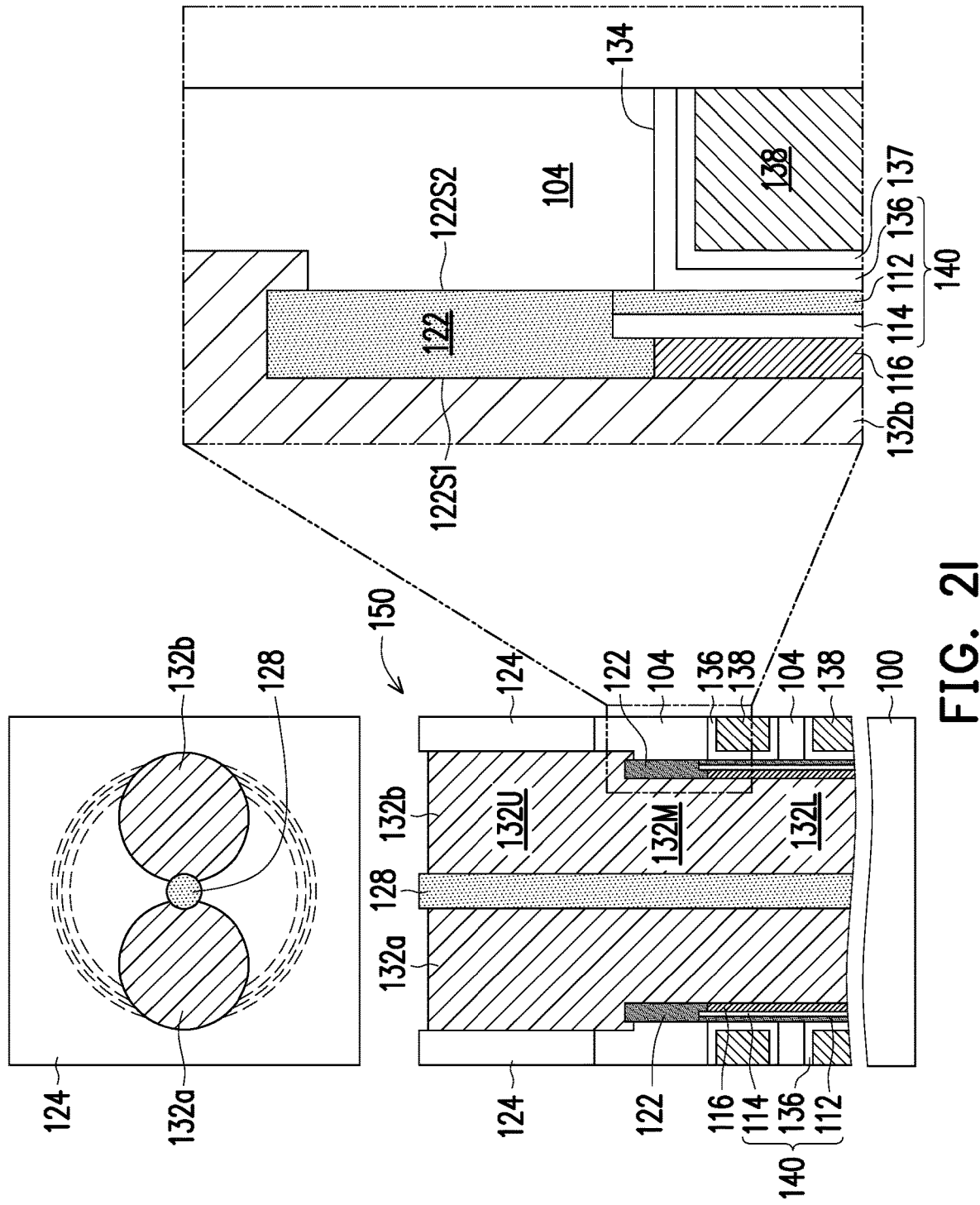

Referring to FIG. 2H and FIG. 2I, conductive pillars 132a and 132b are formed in the holes 130a and 130b. The conductive pillar 132a and the conductive pillar 132b may serve as a source pillar and a drain pillar respectively, and may be respectively electrically connected to the channel pillar 116. The conductive pillars 132a and 132b may each include an upper portion 132U, a middle portion 132M, and a lower portion 132L. The radial dimension of the upper portion 132U is larger than the radial dimensions of the middle portion 132M and the lower portion 132L. The sidewall of the upper portion 132U is covered by the insulating filling layers 124, a portion of the top insulating layer 104 and the insulating pillar 128. A bottom of the upper portion 132U is lower than the top surface of the cap protective cap 122. The upper portion 132U covers the top surface of the protective cap 122 and covers part of an inner sidewall 122S1 and part of an outer sidewall 122S2 of the protective cap 122. The sidewall of the middle portion 132M is covered by the protective cap 122, the insulating filling layer 124 (shown in the top view of FIG. 2I), and the insulating pillar 128. The sidewall of the lower portion 132L is covered by the channel pillar 116, the insulating filling layer 124 (shown in the top view of FIG. 2I), and the insulating pillar 128.

A top surface of the protective cap 122 is lower than a top surface of the gate stack structure 150. The top surface of the protective cap 122 is covered by the upper portions 132U of the conductive pillar 132a and the conductive pillar 132b. The top surface of the protective cap 122 is further covered by the insulating filling layer 124 filled in the channel pillar 116. The protective cap 122 is sandwiched between the conductive pillar 132a and insulating filling layer 124 in a lateral direction. The protective cap 122 is sandwiched between the conductive pillar 132b and insulating filling layer 124 in a lateral direction. The inner sidewall 122S1 of the protective cap 122 is covered by, and is in contact with, the middle portions 132M of the conductive pillar 132a and the conductive pillar 132b and the insulating filling layer 124. The outer sidewall 122S2 of the protective cap 122 is covered by the upper portions 132U of the conductive pillars 132a and 132b and the (top) insulating layer 104 of the gate stack structure 150. The bottom surface of the protective cap 122 covers and lands on the channel pillar 116, and the tunneling layer 114 and the storage layer 112 of the charge storage structure 140.

Afterwards, referring to FIG. 2I, a replacement process is performed. In some embodiments, the replacement process replaces the sacrificial layers 106 with a plurality of gate layers 138. First, a patterning process is performed on the stack structure 102 to form a plurality of slit trenches (not shown) therein, so that the stack structure 102 is divided into a plurality of blocks. Then, an etching process (e.g., a wet etching process) is performed to inject an etching solution into the slit trenches and sequentially remove the sacrificial layers 106 to form a plurality of horizontal openings 134. Next, a gate material layer is sequentially formed in the slit trenches and the horizontal openings 134. Afterwards, an etch-back process is performed to remove the gate material layer in the slit trenches to form a plurality of gate layers 138 in the horizontal openings 134. In addition, in other embodiments, before the gate layers 138 are formed, the oxide layers 110 (shown in FIG. 2H) are further removed, and a blocking material layer and a barrier material layer are sequentially formed in the slit trenches and the horizontal openings 134. The material of the blocking material layer is, for example, a high dielectric constant material having a dielectric constant greater than 7, such as aluminum oxide ($Al_2O_3$), hafnium oxide ($HfO_2$), lanthanum oxide ($La_2O_5$), transition metal oxide, lanthanide oxide, or combinations thereof. The material of the barrier material layer is, for example, titanium (Ti), titanium nitride (TiN), tantalum (Ta), tantalum nitride (TaN), or a combination thereof. After an etch-back process is formed on the blocking material layer and the barrier material layer, a plurality of blocking layers 136 and a plurality of barrier layers 137 are formed in the horizontal openings 134. The barrier layer 137 is located between the blocking layer 136 and the gate layer 138. The blocking layer 136, the storage layer 112 and the tunneling layer 114 are collectively referred to as a charge storage structure 140. At this time, a gate stack structure 150 is formed. The gate stack structure 150 is disposed on the dielectric substrate 100 and includes a plurality of gate layers 138 and a plurality of insulating layers 104 stacked alternately with each other.

In the above embodiment, the storage material layer 112' and the tunneling material layer 114' are formed right after the opening 108 is formed (as shown in FIG. 2B). However, the embodiment of the disclosure is not limited thereto. In other embodiments, the tunneling material layer and the storage material layer may also be formed in subsequent fabrication processes, as shown in FIG. 3A to FIG. 3I.

Figure 3D:
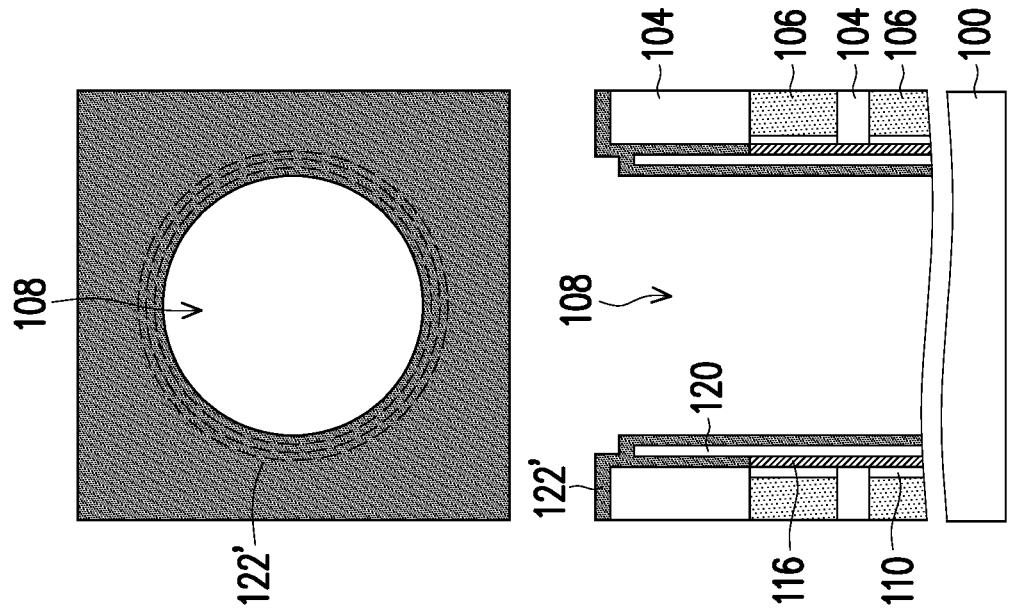
Figure 3C:
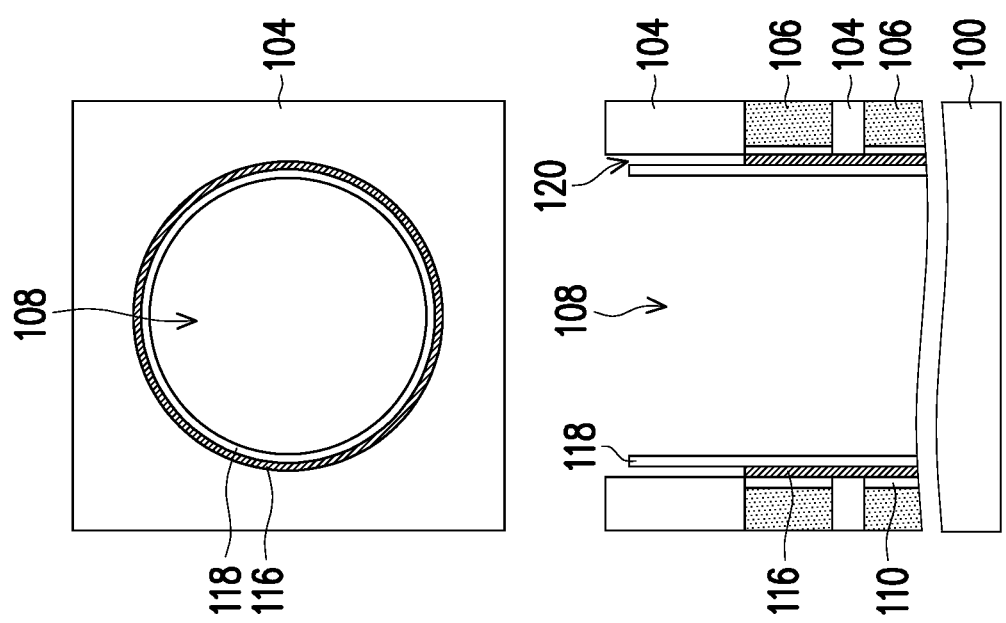
Figure 3G:
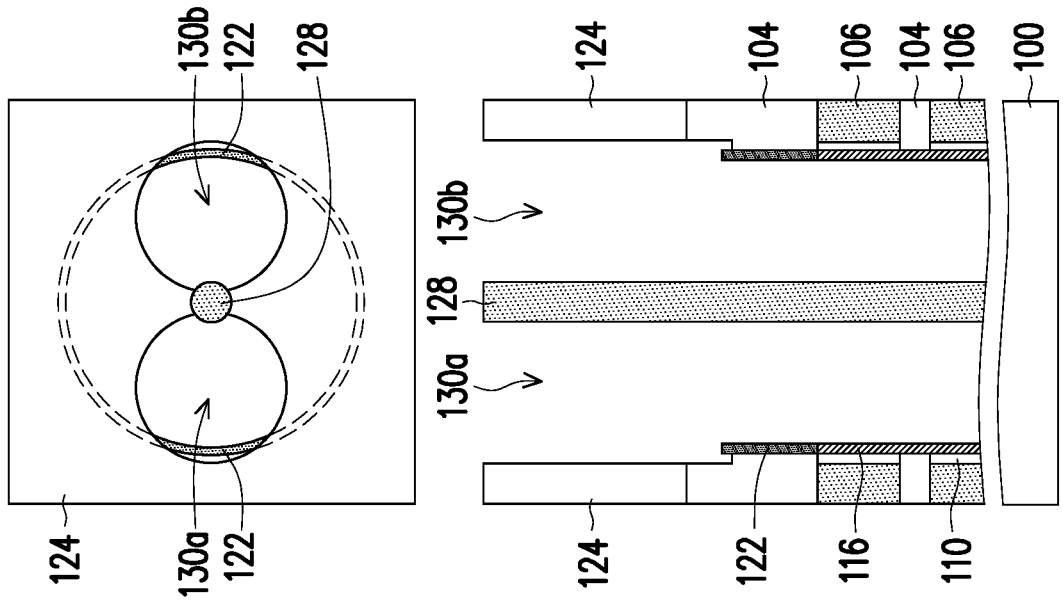
Figure 3H:
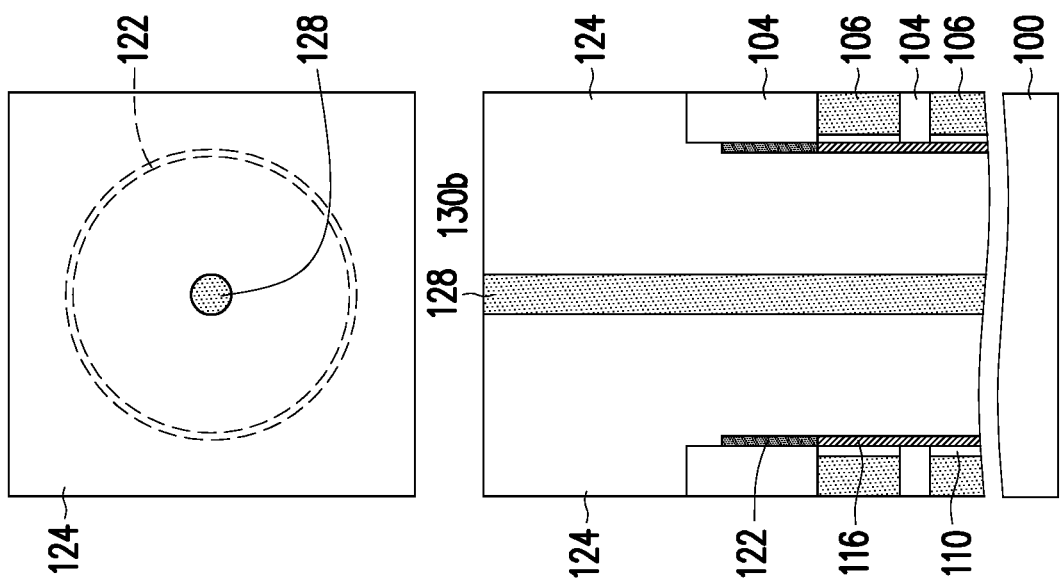
Figure 3I:
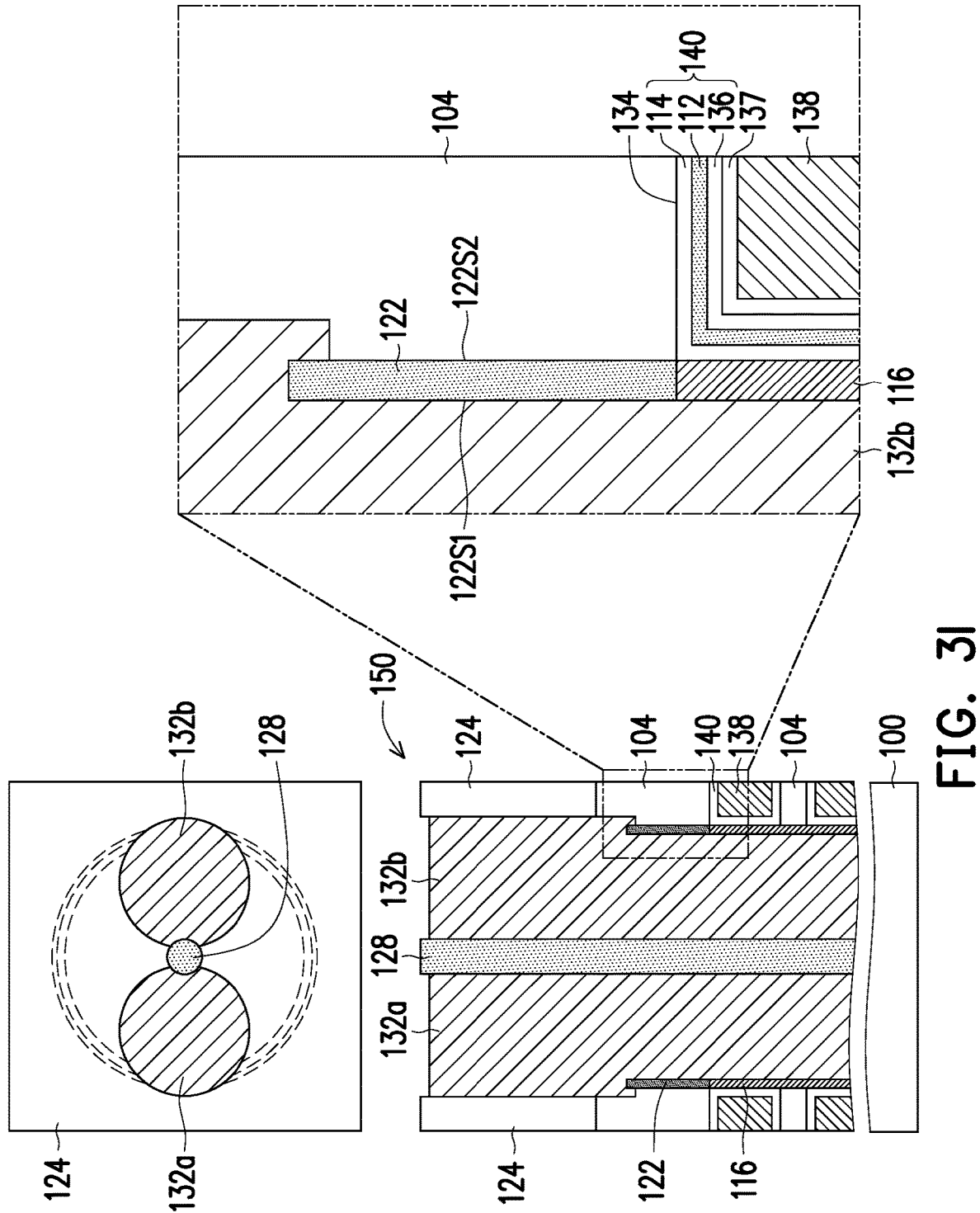

In the following descriptions, a gate stacke structure is formed by another embodiment. Referring to FIG. 3A to FIG. 3B, right after the opening 108 is formed, a channel material layer 116' and a spacer material layer 118' are formed. Afterwards, a protective cap 122 is formed according to the method of the embodiment shown in FIG. 3C to FIG. 3F), which is similar to the above embodiment (as shown in FIG. 2C to FIG. 2F). An insulating filling layer 124, an insulating pillar 128, a conductive pillar 132a, and a conductive pillar 132b are formed (as shown in FIG. 3G to FIG. 3I). The processes in FIG. 3G to FIG. 3I are similar to the above embodiment (as shown in FIG. 2G to FIG. 2I).

Referring to FIG. 3H and FIG. 3I, a replacement process is performed, which is different from the replacement process in FIG. 2H to FIG. 2I. In this embodiment, the replacement process replaces the sacrificial layers 106 with a storage layer 112, a tunneling layer 114, and a plurality of gate layers 138. After slit trenches are formed according to the method of the above embodiment, the sacrificial layers 106 and the oxide layer 110 are removed and horizontal openings 134 are formed. A tunneling material layer, a storage material layer, a blocking material layer and a barrier material layer are sequentially formed in the slit trenches and the horizontal openings 134. Then a gate material layer is formed in the slit trenches and the horizontal openings 134. Afterwards, an etch-back process is performed to remove the multiple layers in the slit trenches. The multiple layers include tunneling material layer, a storage material layer, blocking material layer and a barrier material layer and the gate material layer. In each horizontal openings 134, a tunneling layer 114, a storage layer 112, a blocking layers 136 and a barrier layers 137 are formed in interior surface of the horizontal openings 134. The gate layer 138 is filled in the remaining space of the horizontal openings 134. At this time, a gate stack structure 150 is formed. The blocking layer 136, the storage layer 112 and the tunneling layer 114 are collectively referred to as a charge storage structure 140. The gate stack structure 150 is disposed on the dielectric substrate 100 and includes a plurality of gate layers 138 and a plurality of insulating layers 104 stacked alternately with each other.

In this embodiment, a top surface of the protective cap 122 is lower than a top surface of the gate stack structure 150. The top surface of the protective cap 122 is covered by the upper portions 132U of the conductive pillar 132a and the conductive pillar 132b. The top surface of the protective cap 122 is further covered by the insulating filling layer 124 filled in the channel pillar 116. The protective cap 122 is sandwiched between the conductive pillar 132a and insulating filling layer 124 in a lateral direction. The protective cap 122 is sandwiched between the conductive pillar 132b and insulating filling layer 124 in a lateral direction. The inner sidewall 122S1 of the protective cap 122 is covered by, and is in contact with, the middle portions 132M of the conductive pillar 132a and the conductive pillar 132b and the insulating filling layer 124. The outer sidewall 122S2 of the protective cap 122 is covered by the upper portions 132U of the conductive pillars 132a and 132b and the (top) insulating layer 104 of the gate stack structure 150. The bottom surface of the protective cap 122 covers and lands on the channel pillar 116 and is in contact with the tunneling layer 114 of the charge storage structure 140.

In summary of the above, in the disclosure, the protective cap is formed and may protect the channel pillar and prevent the channel pillar from being damaged by etching. Therefore, the top surface of the channel pillar may be controlled to be flush or substantially flush with the top surface of the charge storage structure at the top surface of the uppermost gate layer, so that the device can exhibit good reliability.

What is claimed is:

1. A 3D AND flash memory device comprising:
a gate stack structure disposed on a dielectric substrate and comprising a plurality of gate layers and a plurality of insulating layers alternately stacked with each other;
a channel pillar disposed on the dielectric substrate and penetrating through the gate stack structure;
a first conductive pillar and a second conductive pillar disposed in the channel pillar and penetrating through the gate stack structure, wherein the first conductive pillar and the second conductive pillar are separated from each other and are each connected to the channel pillar;
a charge storage structure disposed between the gate layers and a sidewall of the channel pillar; and
a protective cap covering at least a top surface of the channel pillar, isolating the first conductive pillar from a top gate layer of the plurality of gate layers, and isolating the second conductive pillar from the top gate layer of the plurality of gate layers.

2. The 3D AND flash memory device according to claim 1, wherein a tunneling layer and a storage layer of the charge storage structure surround an outer sidewall of the channel pillar, and top surfaces of the tunneling layer and the storage layer are covered by the protective cap.

3. The 3D AND flash memory device according to claim 1, wherein the charge storage structure surrounds the gate layers.

4. The 3D AND flash memory device according to claim 1, wherein the protective cap is sandwiched between the first conductive pillar and a top-most layer of the plurality of insulating layers in a lateral direction.

5. The 3D AND flash memory device according to claim 1, wherein first conductive pillar comprises an upper portion and a lower portion, and a radial dimension of the upper portion is larger than a radial dimension of the lower portion.

6. The 3D AND flash memory device according to claim 1, wherein a top surface of the protective cap is lower than a top surface of the gate stack structure.

7. The 3D AND flash memory device according to claim 6, wherein the top surface of the protective cap is covered by the first conductive pillar and the second conductive pillar.

8. The 3D AND flash memory device according to claim 7, wherein a sidewall of the protective cap is further partially covered by the first conductive pillar and the second conductive pillar.

9. The 3D AND flash memory device according to claim 6, wherein the top surface of the protective cap is further covered by an insulating filling layer filled in the channel pillar.

10. The 3D AND flash memory device according to claim 9, wherein a material of the protective cap is different from a material of the insulating filling layer.

11. The 3D AND flash memory device according to claim 9, wherein the protective cap and the channel pillar are in a ring shape.

12. The 3D AND flash memory device according to claim 9, wherein a top surface of the channel pillar is coplanar with the charge storage structure at a top surface of the top gate layer.

13. A fabrication method of a 3D AND flash memory device, comprising:
forming a stack structure on a dielectric substrate, wherein the stack structure comprises a plurality of sacrificial layers and a plurality of insulating layers alternately stacked with each other;
forming an opening in the stack structure;
forming a channel pillar in the opening;
forming a protective cap on the channel pillar;
forming an insulating filling layer on the stack structure and the protective cap, and filling the insulating filling layer in the opening;
patterning the insulating filling layer with the protective cap covering on the channel pillar to form a first hole and a second hole in the channel pillar;
forming a first conductive pillar and a second conductive pillar connected to the channel pillar in the first hole and the second hole, respectively;
performing a replacement process to replace the sacrificial layers with a plurality of gate layers; and
forming a charge storage structure between the gate layers and a sidewall of the channel pillar.

14. The fabrication method of the 3D AND flash memory device according to claim 13, wherein the first hole and the second hole expose a part of a top surface of the protective cap.

15. The fabrication method of the 3D AND flash memory device according to claim 13, wherein a method of forming the channel pillar and the protective cap comprises:
forming a channel material layer on the stack structure and in the opening;
forming a spacer material layer on the channel material layer;
performing a first etch-back process to partially remove the channel material layer and the spacer material layer to form the channel pillar and a spacer and form a groove between the stack structure and the spacer;
forming a protective material layer on the stack structure, in the groove, and in the opening;
performing a second etch-back process to partially remove the protective material layer and form the protective cap in the groove, wherein the protective cap covers the channel pillar;
and removing the spacer.

16. The fabrication method of the 3D AND flash memory device according to claim 15, wherein
before the channel material layer is formed, a tunneling material layer and a storage material layer are further formed in the opening, and in the first etch-back process, the tunneling material layer and the storage material layer are further removed to form a tunneling layer and a storage layer of the charge storage structure and the groove, and
the protective cap formed in the groove further covers the tunneling layer and the storage layer.

17. The fabrication method of the 3D AND flash memory device according to claim 15, wherein the charge storage structure is formed in the replacement process and is formed before the gate layers are formed, and the charge storage structure is in contact with the protection cap.

18. The fabrication method of the 3D AND flash memory device according to claim 15, wherein the groove is formed so that a top surface of the channel pillar is flush with a top surface of a top gate layer of the plurality of gate layers.

19. The fabrication method of the 3D AND flash memory device according to claim 15, wherein a material of the protective material layer is different from a material of the insulating filling layer.

* * * * *